(12) United States Patent
Nakanishi

(10) Patent No.: US 7,769,916 B2
(45) Date of Patent: Aug. 3, 2010

(54) SEMICONDUCTOR STORAGE DEVICE, ELECTRONIC APPARATUS, AND MODE SETTING METHOD

(75) Inventor: Kenichi Nakanishi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/519,251

(22) Filed: Sep. 11, 2006

(65) Prior Publication Data

US 2007/0058464 A1 Mar. 15, 2007

(30) Foreign Application Priority Data

Sep. 12, 2005 (JP) .............................. 2005-264256

(51) Int. Cl.
*G06F 3/00* (2006.01)
(52) U.S. Cl. .............................. 710/14; 710/11; 713/100
(58) Field of Classification Search ................... 710/13, 710/14, 11
See application file for complete search history.

(56) References Cited

U.S. PATENT DOCUMENTS

| | | | | |
|---|---|---|---|---|
| 5,761,528 | A * | 6/1998 | Arai | 710/2 |
| 5,889,721 | A | 3/1999 | Gannage | |
| 6,470,284 | B1 * | 10/2002 | Oh et al. | 702/64 |
| 6,941,402 | B2 * | 9/2005 | Tashiro | 710/301 |
| 2004/0089717 | A1 | 5/2004 | Harari et al. | |
| 2005/0086033 | A1 * | 4/2005 | Chen et al. | 703/2 |
| 2006/0026332 | A1 * | 2/2006 | Yen | 710/313 |
| 2006/0085653 | A1 * | 4/2006 | Bollinger et al. | 713/300 |

FOREIGN PATENT DOCUMENTS

| | | |
|---|---|---|
| EP | 1 085 516 A2 | 3/2001 |
| EP | 1 477 901 A1 | 11/2004 |
| JP | 07-131504 | 5/1995 |
| JP | 2004-185244 | 7/2004 |

OTHER PUBLICATIONS

Wolfgang Rankl, Wolfgang Effing; Handbuch der Chipkarten; 2002 Carl Hanser Verlag Munchen; ISBN 3-446-22036-4.

* cited by examiner

*Primary Examiner*—Henry W. H. Tsai
*Assistant Examiner*—Elias Mamo
(74) *Attorney, Agent, or Firm*—Robert J. Depke; Rockey, Depke & Lyons, LLC

(57) ABSTRACT

Disclosed herein is a semiconductor storage device operable in a plurality of operation modes each having a separate maximum current consumption. The device includes: a data communication section configured to be capable of performing data communication in a plurality of communication modes; an attribute information storage section configured to store attribute information indicating the operation and communication modes; and a mode setting section configured to set the device to one of the operation modes and one of the communication modes. The data communication section transmits, to an electronic apparatus to which the device is attached, the information and receives from the apparatus a mode setting command for directing that the device be set to a combination of an operation mode and a communication mode selected from among the information. In accordance therewith, the mode setting section sets the device to the selected combination of modes.

15 Claims, 10 Drawing Sheets

FIG. 4

| COMMUNICATION MODE INFORMATION 33 | OPERATION MODE INFORMATION 34 |
|---|---|
| INITIAL COMMUNICATION MODE | INITIAL OPERATION MODE |
| COMMUNICATION MODE 1 | OPERATION MODE 1 |
| ⋮ | ⋮ |
| COMMUNICATION MODE N | OPERATION MODE N |

35

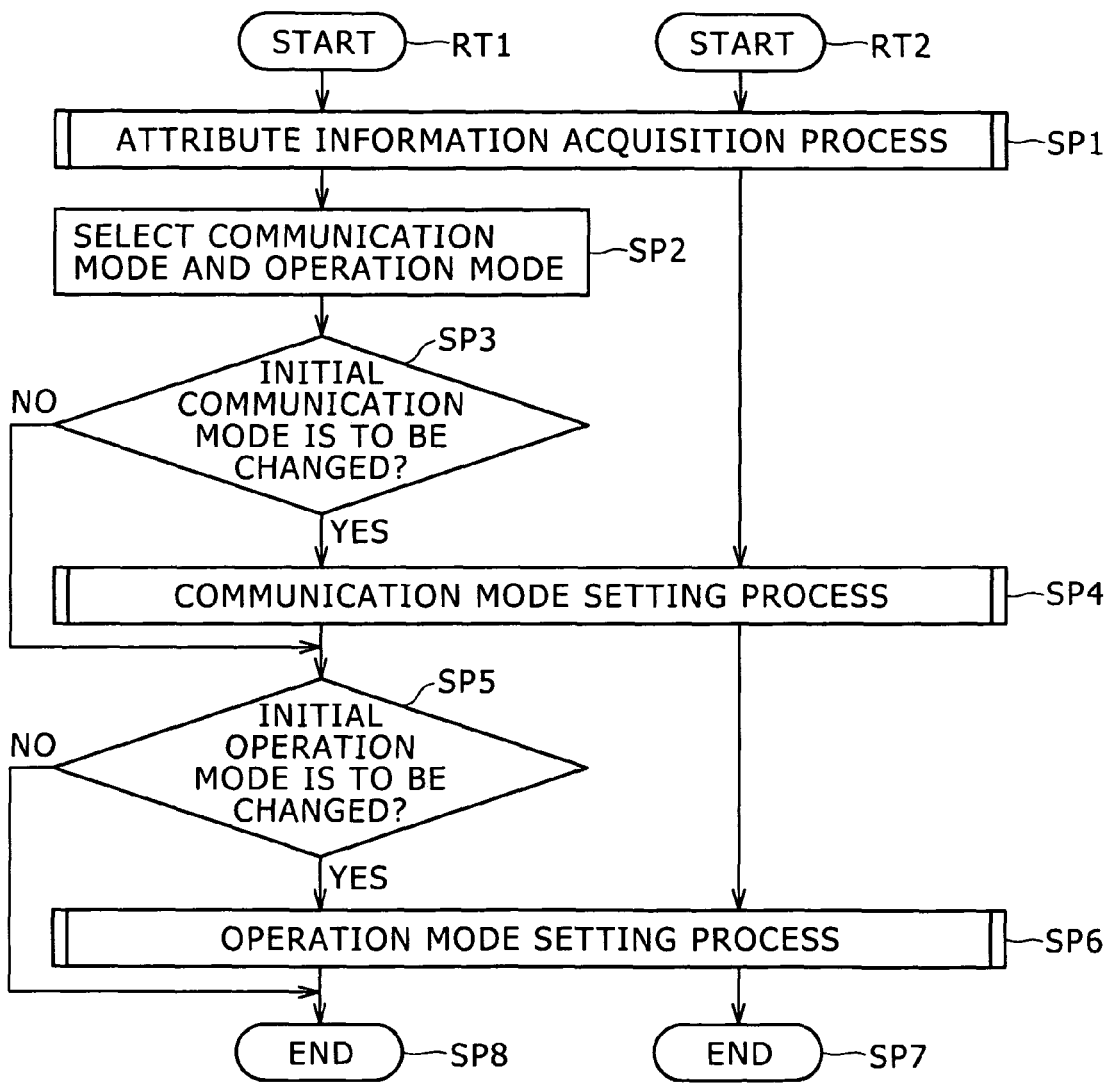

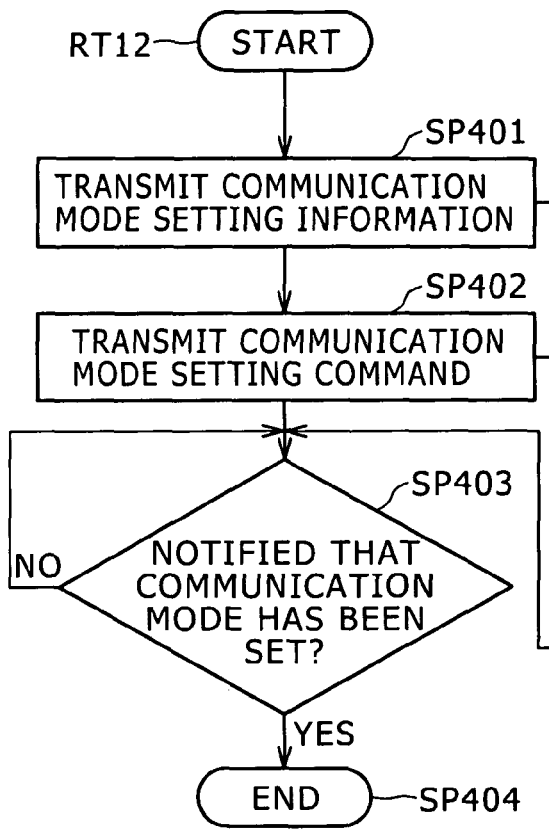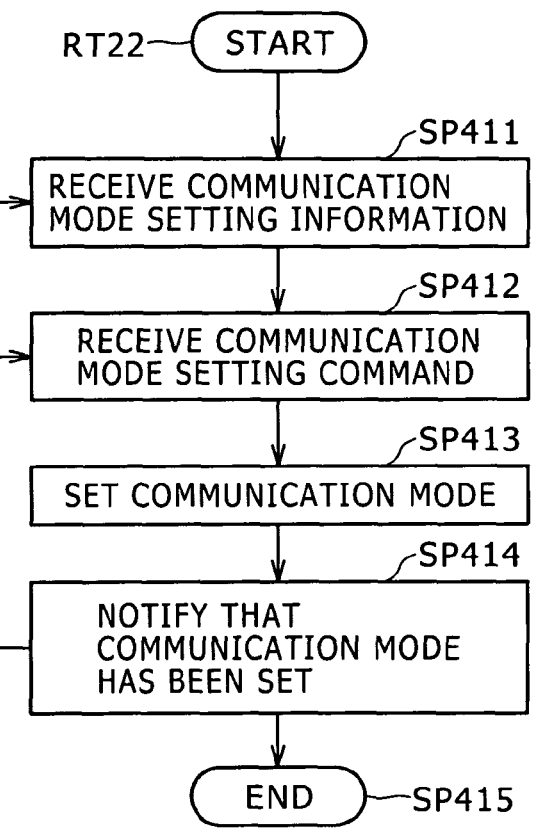

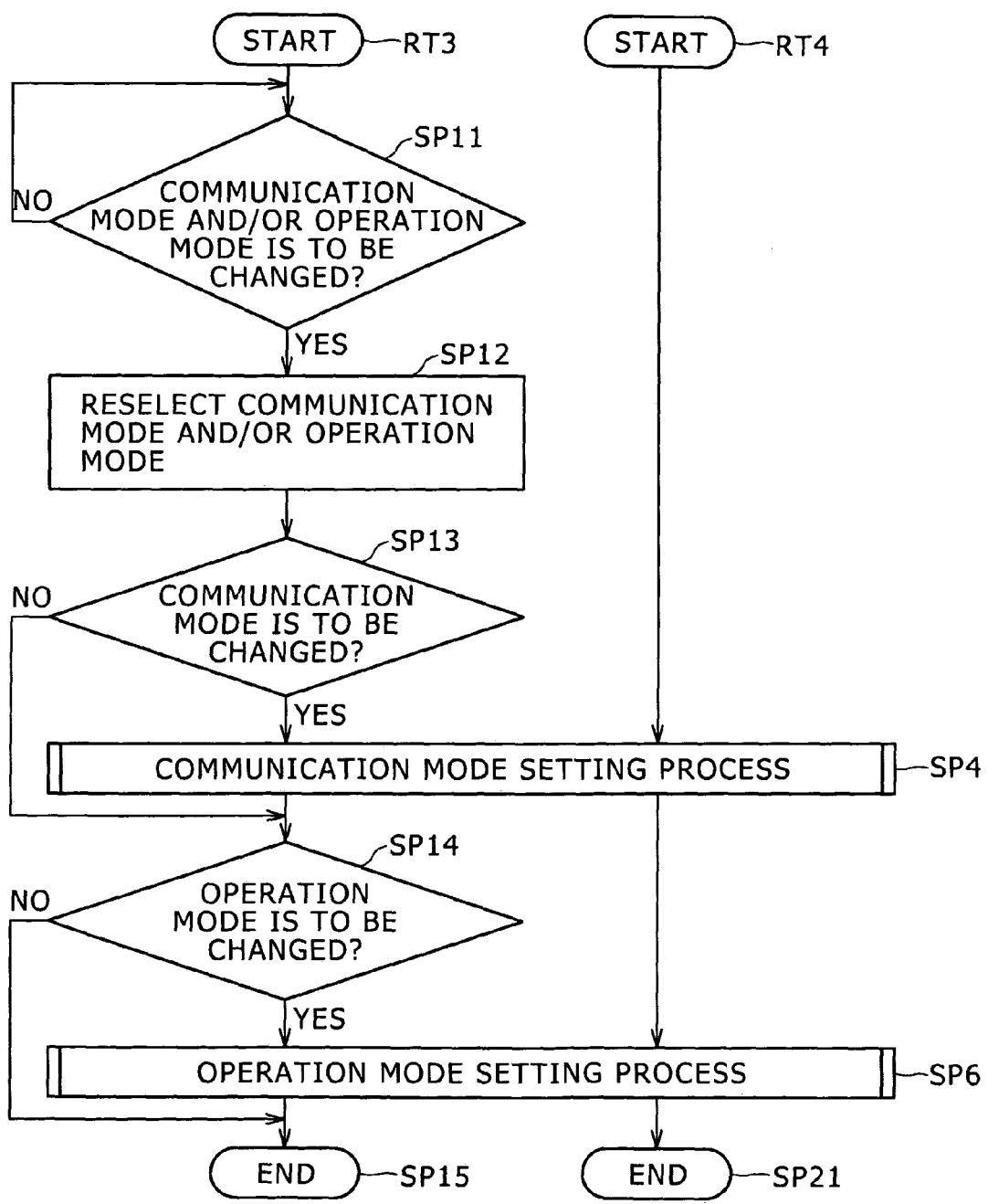

US 7,769,916 B2

SEMICONDUCTOR STORAGE DEVICE, ELECTRONIC APPARATUS, AND MODE SETTING METHOD

CROSS REFERENCES TO RELATED APPLICATIONS

The present invention contains subject matter related to Japanese Patent Application JP 2005-264256, filed in the Japanese Patent Office on Sep. 12, 2005, the entire contents of which being incorporated herein by reference.

BACKGROUND OF THE INVENTION

1. Field of the Invention

The present invention relates to a semiconductor storage device, an electronic apparatus, and a mode setting method. For example, the present invention is suitably applicable to a situation in which an electronic apparatus to which a semiconductor storage device is attached sets, for the semiconductor storage device, modes in which the semiconductor storage device operates.

2. Description of the Related Art

Known data transfer apparatuses transmit and receive both serial signals and parallel signals (see. Japanese Patent Laid-open No. Hei 7-131504 (page 1, FIG. 1), for example). In addition, some of the card type semiconductor storage devices, which assume the shape of a card and have been widely used as semiconductor storage devices in recent years, are capable of performing both serial communication and parallel communication with electronic apparatuses, such as personal computers and the like, to which the card type semiconductor storage devices are attached.

SUMMARY OF THE INVENTION

In some of such card type semiconductor storage devices, a maximum current consumption when they operate while performing serial communication with an electronic apparatus and a maximum current consumption when they operate while performing parallel communication with an electronic apparatus are each uniquely determined in advance. Therefore, when an electronic apparatus to which such a card type semiconductor storage device is attached performs the serial communication with the card type semiconductor storage device, the electronic apparatus supplies, to the card type semiconductor storage device, the only operating current that matches the maximum current consumption uniquely determined for the serial communication. The electronic apparatus thus allows the card type semiconductor storage device to operate with that operating current. Meanwhile, when performing the parallel communication with the card type semiconductor storage device, the electronic apparatus supplies, to the card type semiconductor storage device, the only operating current that matches the maximum current consumption uniquely determined for the parallel communication. The electronic apparatus thus allows the card type semiconductor storage device to operate with that operating current.

However, if the maximum current consumption for the serial communication or the parallel communication changes as a result of, e.g., a specification change of the card type semiconductor storage device, the card type semiconductor storage device may not be able to operate even if it is attachable to an electronic apparatus. This happens when the electronic apparatus is capable of supplying the only operating current that matches the old maximum current consumption and not capable of supplying the only operating current that matches a new maximum current consumption. As such, although the use of such card type semiconductor storage devices has been spreading remarkably in recent years, they are not convenient enough yet.

An advantage of the present invention is to provide a semiconductor storage device capable of providing greatly improved convenience, and an electronic apparatus and a mode setting method which are capable of providing the semiconductor storage device with greatly improved convenience.

According to one embodiment of the present invention, when setting an operation mode and a communication mode of a semiconductor storage device capable of operating in a plurality of operation modes each having a separate maximum current consumption and also capable of performing data communication in a plurality of communication modes, in an electronic apparatus to which the semiconductor storage device is attached, attribute information indicating the plurality of operation modes and the plurality of communication modes transmitted from the semiconductor storage device is received; an arbitrary combination of an operation mode and a communication mode is selected from among the plurality of operation modes and the plurality of communication modes indicated by the received attribute information; and a mode setting command for directing that the semiconductor storage device be set to the selected combination of the operation mode and the communication mode is transmitted to the semiconductor storage device.

Therefore, according to this embodiment of the present invention, by use of the electronic apparatus, it is possible to set the semiconductor storage device to the combination of the operation mode and the communication mode arbitrarily selected from among the plurality of communication modes and the plurality of operation modes. Thus, according to this embodiment of the present invention, it is possible to greatly reduce the number of electronic apparatuses that are capable of having attached thereto the semiconductor storage device but not capable of causing the semiconductor storage device to operate. Thus, there are realized a semiconductor storage device capable of providing greatly improved convenience, and an electronic apparatus and a mode setting method which are capable of providing the semiconductor storage device with greatly improved convenience.

BRIEF DESCRIPTION OF THE DRAWINGS

FIG. 4 is a diagram illustrating a structure of attribute information;

FIG. 5 is a flowchart illustrating a mode setting process;

FIG. 7 is a flowchart illustrating a communication mode setting process;

FIG. 9 is a flowchart illustrating a mode setting change process; and

DETAILED DESCRIPTION OF THE PREFERRED EMBODIMENTS

Hereinafter, one embodiment of the present invention will be described in detail with reference to the accompanying drawings.

Figure 1:
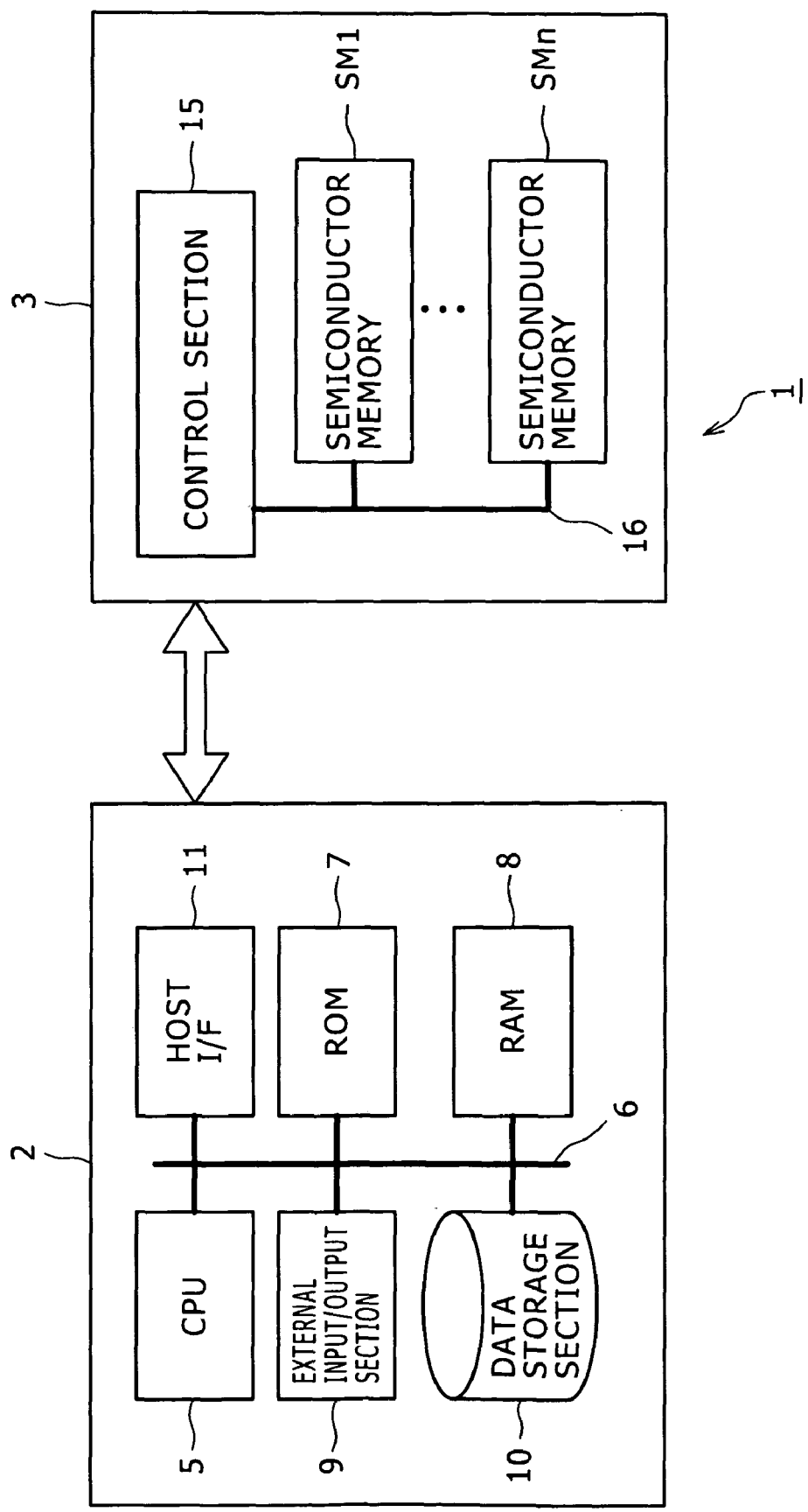
FIG. 1 is a block diagram illustrating an overall structure of a data communication system according to one embodiment of the present invention.

In FIG. 1, reference numeral 1 indicates a data communication system to which one embodiment of the present invention is applied as a whole, and the data communication system 1 includes an electronic apparatus 2, such as a personal computer, and a card type semiconductor storage device 3 which is removably attached to the electronic apparatus 2. In this example, the electronic apparatus 2 includes a central processing unit (CPU) 5, a bus 6, and various hardware components, such as a read only memory (ROM) 7, a random access memory (RAM) 8, etc., connected to the CPU 5 via the bus 6. The CPU 5 reads from the ROM 7 various programs stored previously therein and expands and executes the programs in the RAM 8, thus controlling the entire electronic apparatus 2 and performing various processes.

Thus, the CPU 5 fetches various data supplied from an external device (not shown) or the like via an external input/output section 9 such as an I/O (Input/Output), and stores and accumulates the fetched various data in a data storage section 10, such as a hard disk drive, a semiconductor memory, or the like. The CPU 5 is also capable of reading various data from the data storage section 10 and outputting them to the external device or the like via the external input/output section 9. Further, in the case where the card type semiconductor storage device 3 has been attached to the electronic apparatus 2, the CPU 5 transmits various instructions (hereinafter referred to as "commands") to the card type semiconductor storage device 3 via a host interface 11 as necessary while supplying an operating current thereto, thereby allowing the card type semiconductor storage device 3 to operate. In this manner, the CPU 5 is capable of reading the various data stored and accumulated, for example, in the data storage section 10 therefrom and transmitting the data to the card type semiconductor storage device 3 via the host interface 11 to allow the card type semiconductor storage device 3 to store the data. The CPU 5 is also capable of fetching various data stored in the card type semiconductor storage device 3 via the host interface 11 and storing and accumulating the data in the data storage section 10.

Meanwhile, the card type semiconductor storage device 3 includes a control section 15, a bus 16, and a plurality of semiconductor memories SM1 to SMn, such as flash memories or the like, connected to the control section 15 via the bus 16. The control section 15 controls the entire card type semiconductor storage device 3 based on the commands supplied from the electronic apparatus 2. Thus, the control section 15 is capable of fetching the various data transmitted from the electronic apparatus 2 and storing the data in the semiconductor memories SM1 to SMn. The control section 15 is also capable of reading the various data from the semiconductor memories SM1 to SMn and transmitting the data to the electronic apparatus 2.

Figure 2:
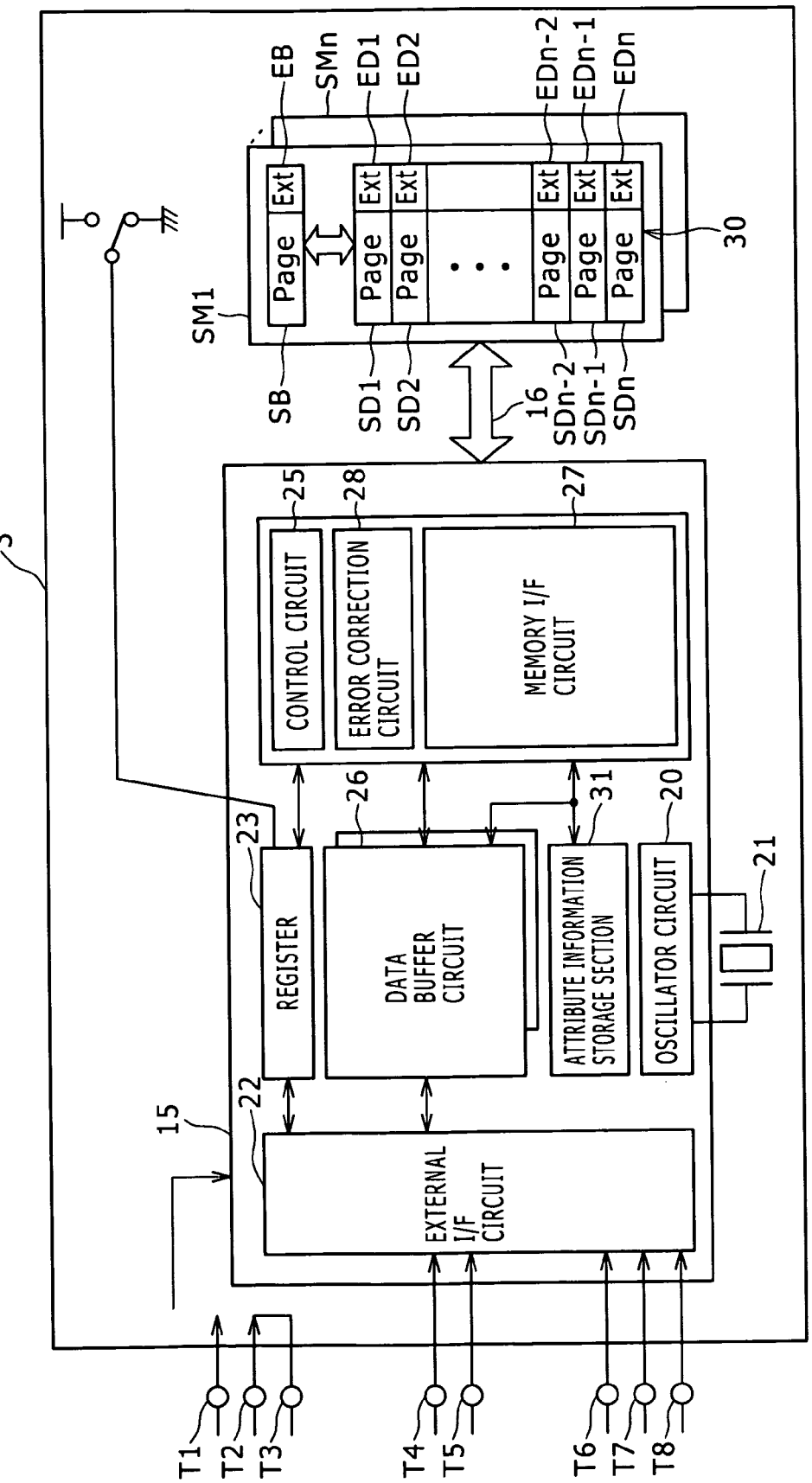
FIG. 2 is a block diagram illustrating a circuit structure of a card type semiconductor storage device.

As illustrated in FIG. 2, the card type semiconductor storage device 3 includes a plurality of external connection terminals T1 to T8, and when it is attached to the electronic apparatus 2, the card type semiconductor storage device 3 takes in the operating current supplied from the electronic apparatus 2 via the external connection terminal T1 designed for taking in power, and starts operation by the taken-in operating current. The card type semiconductor storage device 3 is also capable of allowing the electronic apparatus 2 to detect whether or not the card type semiconductor storage device 3 has been attached thereto or removed therefrom via the external connection terminals T2 and T3 designed for attachment and removal detection. Further, in the card type semiconductor storage device 3, an oscillator circuit 20 is provided within the control section 15 formed by, e.g., an integrated circuit (IC) chip, and a crystal oscillator 21 is provided outside the control section 15. The oscillator circuit 20 and the crystal oscillator 21 generate a predetermined oscillation frequency. The control section 15 also takes in a clock signal supplied from the electronic apparatus 2 via the external connection terminals T4 and T5 designed for input and output of control signals, and supplies the clock signal to a control circuit 25, such as a sequencer, via an external interface circuit 22 and a register 23. Based on the oscillation frequency generated by the oscillator circuit 20 and the crystal oscillator 21, the control circuit 25 generates an operating clock synchronous with the clock signal and executes various processes in synchronization with the operating clock.

Thus, if a control signal, such as a signal called a bus state for checking a communication state in connection with the electronic apparatus 2, is transmitted from the electronic apparatus 2, the control circuit 25 takes the control signal into the register 23 via the external connection terminals T4 and T5 and the external interface circuit 22, and writes the control signal on the register 23. Then, the control circuit 25 transmits, to the electronic apparatus 2, a signal in accordance with the control signal written on the register 23 via a data buffer circuit 26, the external interface circuit 22, and the external connection terminals T4 and T5. Thus, the control circuit 25 is capable of notifying the electronic apparatus 2 of various states of the card type semiconductor storage device 3, for example.

Further, if a command such as a write command, a read command, or the like is transmitted from the electronic apparatus 2, the control circuit 25 takes the command into the register 23 via the external connection terminals T6 to T8 designed for data input and output and the external interface circuit 22, and writes the command on the register 23. In the case where the command in the register 23 is the write command, the control circuit 25 takes data transmitted from the electronic apparatus 2 together with the write command temporarily into the data buffer circuit 26 via the external connection terminals T6 to T8 and the external interface circuit 22. Then, while transferring the data from the data buffer circuit 26 to a memory interface circuit 27, the control circuit 25 uses an error correction circuit 28 to add an error correction code to the data and sends it to the semiconductor memories SM1 and SMn.

Each of the semiconductor memories SM1 to SMn is provided with a storage block 30 used for data storage and composed of a plurality of cells SD1 to SDn having redundant portions ED1 to EDn, respectively, and a cell SB (hereinafter referred to as a "buffer cell") used as a buffer and having a redundant portion EB. Thus, in each of the semiconductor memories SM1 to SMn, the control circuit 25 writes data in the cells SD1 to SDn within the storage block 30 via the buffer cell SB.

In the case where the command in the register 23 is the read command, the control circuit 25 reads data from the cells SD1 to SDn within the storage block 30 in the semiconductor memories SM1 to SMn and transfers the read data to the memory interface circuit 27 via the buffer cell SB. Then, in the memory interface circuit 27, the control circuit 25 performs an error correction process on the data using the error correction circuit 28, and transmits the resultant data to the electronic apparatus 2 via the data buffer circuit 26, the external interface circuit 22, and the external connection terminals T6 to T8. In this manner, the control circuit 25 is capable of performing data communication with the electronic apparatus 2.

In addition, the card type semiconductor storage device 3 is in advance prepared with a plurality of communication modes in which to perform data communication with the electronic apparatus 2, such as 1-bit serial communication, 4-bit parallel communication, 8-bit parallel communication, and the like. The card type semiconductor storage device 3 is configured to be capable of performing data communication in any one of the plurality of communication modes.

Figure 3A:
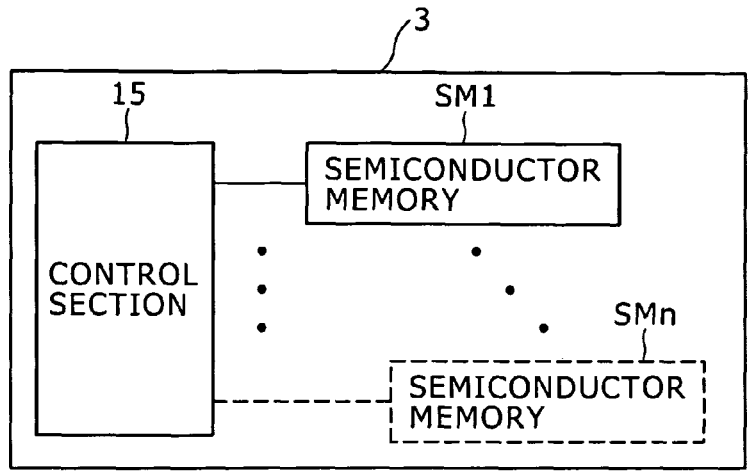
FIG. 3 is diagram for explaining the change of the number of semiconductor memories operating in the card type semiconductor storage device in accordance with a communication mode.
Figure 3B:
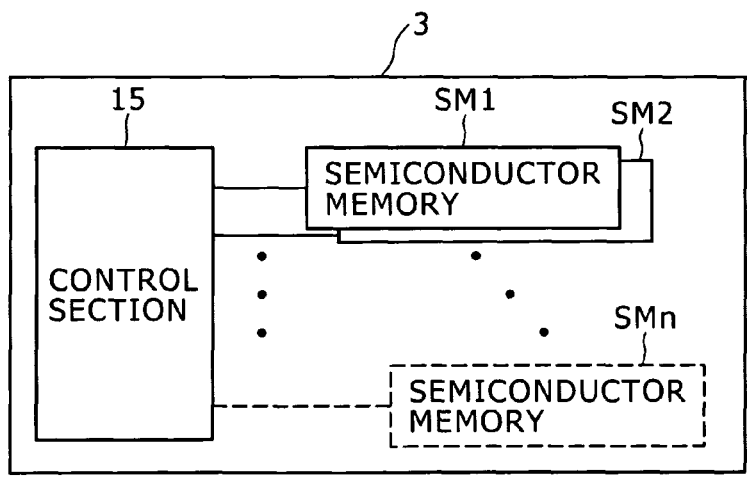
Figure 3C:
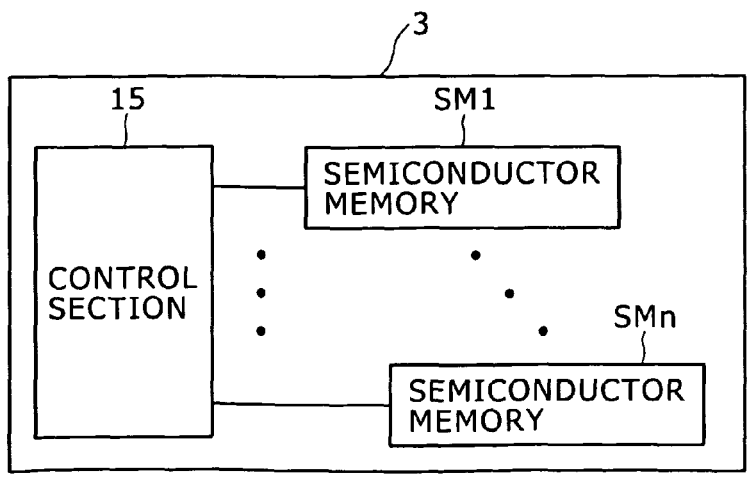

In addition, as illustrated in FIGS. 3A to 3C, the card type semiconductor storage device 3 is also configured to be capable of changing the number of semiconductor memories SM1 to SMn that are caused to operate for writing and reading data. Specifically, the card type semiconductor storage device 3 causes one of the semiconductor memories SM1 to SMn to operate when performing the 1-bit serial communication, four of the semiconductor memories SM1 to SMn to operate concurrently when performing the 4-bit parallel communication, and four or more than four of the semiconductor memories SM1 to SMn to operate concurrently when performing the 8-bit parallel communication, for example. In such a manner, the card type semiconductor storage device 3 is capable of varying the number of semiconductor memories SM1 to SMn that are caused to operate for writing and reading data in accordance with the communication mode adopted for data communication.

Thus, when the communication mode adopted involves a relatively small amount of data transfer per unit time, the card type semiconductor storage device 3 accordingly decreases the number of semiconductor memories SM1 to SMn that are caused to operate for writing and reading data, thereby avoiding unnecessary operation of the semiconductor memories SM1 to SMn. Also, when the communication mode adopted involves a relatively large amount of data transfer per unit time, the card type semiconductor storage device 3 accordingly increases the number of semiconductor memories SM1 to SMn that are caused to operate for writing and reading data, thereby enabling writing and reading of data on and from the semiconductor memories SM1 to SMn to be performed at a relatively high rate and efficiency.

In the card type semiconductor storage device 3, when a small number of semiconductor memories SM1 to SMn are caused to operate for writing and reading data, the current consumption of the card type semiconductor storage device 3 is relatively small. In the card type semiconductor storage device 3, if the number of semiconductor memories SM1 to SMn that are caused to operate for writing and reading data is increased, the current consumption of the card type semiconductor storage device 3 is increased accordingly. In addition, in the card type semiconductor storage device 3, if a data processing rate in data communication with the electronic apparatus 2 or in writing and reading of data on and from the same number of semiconductor memories is made lower, the current consumption of the card type semiconductor storage device 3 tends to become smaller. In contrast, in the card type semiconductor storage device 3, if the data processing rate is made higher, the current consumption of the card type semiconductor storage device 3 tends to become larger.

As such, the card type semiconductor storage device 3 is in advance prepared with a plurality of operation modes each with a separate maximum current consumption, such as 65 mA, 100 mA, 150 mA, 250 mA, and so on. The card type semiconductor storage device 3 is configured to operate, in each one of the plurality of operation modes, with an operating current that matches the corresponding maximum current consumption (i.e., with an operating current close to or substantially identical to the corresponding maximum current consumption).

As such, as illustrated in FIG. 4, attribute information 35 composed of communication mode information 33 indicating the previously-prepared plurality of communication modes and operation mode information 34 indicating the previously-prepared plurality of operation modes is stored in an attribute information storage section 31, such as a ROM or the like, provided in the control section 15 in the card type semiconductor storage device 3. The communication mode information 33 indicates, as the plurality of communication modes, 1-bit serial communication, 4-bit parallel communication, 8-bit parallel communication, and so on. Note that, in the communication mode information 33, one of the communication modes that has the lowest communication ability of all, e.g., the 1-bit serial communication, is described to be an initial communication mode, which is automatically selected as an initial setting when the card type semiconductor storage device 3 is activated. Meanwhile, the operation mode information 34 indicates, as the plurality of operation modes, the maximum current consumptions such as 65 mA, 100 mA, 150, mA, 250 mA, and so on. Note that, in the operation mode information 34, one of the operation modes that has the lowest operation ability of all, e.g., the operation mode having a maximum current consumption of 65 mA, is described to be an initial operation mode, which is automatically selected as an initial setting when the card type semiconductor storage device 3 is activated.

When the card type semiconductor storage device 3 has been attached to the electronic apparatus 2, the control circuit 25 reads the attribute information 35 from the attribute information storage section 31 in response to a request from the electronic apparatus 2, and transmits the read attribute information 35 to the electronic apparatus 2 via the data buffer circuit 26, the external interface circuit 22, and the external connection terminals T6 to T8, for example. Then, in accordance with the attribute information 35 and a communication ability and an operating current supplying ability (i.e., an ability to supply an operating current) of the electronic apparatus 2 (hereinafter, the communication ability and the operating current supplying ability are collectively referred to as "apparatus abilities"), the CPU 5 of the electronic apparatus 2 selects, from the plurality of communication modes indicated by the communication mode information 33 within the attribute information 35, an arbitrary communication mode in which to cause the card type semiconductor storage device 3 to operate. Also, in accordance with the attribute information 35 and the communication ability and the operating current supplying ability of the electronic apparatus 2 described above, the CPU 5 of the electronics apparatus 2 selects, from the plurality of operation modes indicated by the operation mode information 34 within the attribute information 35, an arbitrary operation mode in which to cause the card type semiconductor storage device 3 to operate. Then, the CPU 5 makes settings so that the card type semiconductor storage device 3 operates in the selected communication mode and operation mode. In such a manner, the CPU 5 of the electronic apparatus 2 is capable of establishing, for the card type semiconductor storage device 3, an environment (hereinafter referred to as an "data processing environment") in which data processing, such as data communication, writing and reading of data, or the like, is performed.

Note that the CPU 5 of the electronic apparatus 2 has a communication ability to communicate with the card type semiconductor storage device 3 in the initial communication mode indicated by the communication mode information 33 within the attribute information 35. The CPU 5 also has a supplying ability to supply, to the card type semiconductor storage device 3, the operating current that matches the maximum current consumption of the initial operation mode indicated by the operation mode information 34 within the attribute information 35. When the card type semiconductor storage device 3 has been attached to the electronic apparatus 2, the CPU 5 configures itself to supply to the card type semiconductor storage device 3 the operating current that matches the maximum current consumption corresponding to the initial operation mode, and also configures itself to communicate with the card type semiconductor storage device 3 in the initial communication mode. Meanwhile, when the card type semiconductor storage device 3 has been attached to the electronic apparatus 2, the control circuit 25 of the card type semiconductor storage device 3 automatically initializes the data processing environment so that the card type semiconductor storage device 3 carries out data processing in the initial operation mode and the initial communication mode. As a result, when the card type semiconductor storage device 3 has been attached to the electronic apparatus 2, the control circuit 25 becomes able to operate with the operating current supplied from the electronic apparatus 2 because of combined abilities of the card type semiconductor storage device 3 and the electronic apparatus 2, and also to perform communication promptly in connection with the electronic apparatus 2.

If the card type semiconductor storage device 3 is attached to the electronic apparatus 2 and communication therebetween is established due to the combination of their abilities, the CPU 5 starts a routine RT1 on the electronic apparatus 2 side of a mode setting process as illustrated in FIG. 5 in accordance with a mode setting program previously stored in the ROM 7. Note that the CPU 5 of the electronic apparatus 2 takes the initiative in a relationship with the card type semiconductor storage device 3, whereas the control circuit 25 of the card type semiconductor storage device 3 functions subordinately in the relationship with the electronic apparatus 2. Therefore, when the card type semiconductor storage device 3 is attached to the electronic apparatus 2 and the communication therebetween is established due to the combination of their abilities, the control circuit 25 of the card type semiconductor storage device 3 starts a routine RT2 on the card type semiconductor storage device 3 side. In the routine RT2, the control circuit 25 waits to receive the control signal or the command transmitted from the CPU 5 of the electronic apparatus 2 and, upon receipt of the control signal or the command, performs a process according to the control signal or the command.

Figure 6A:
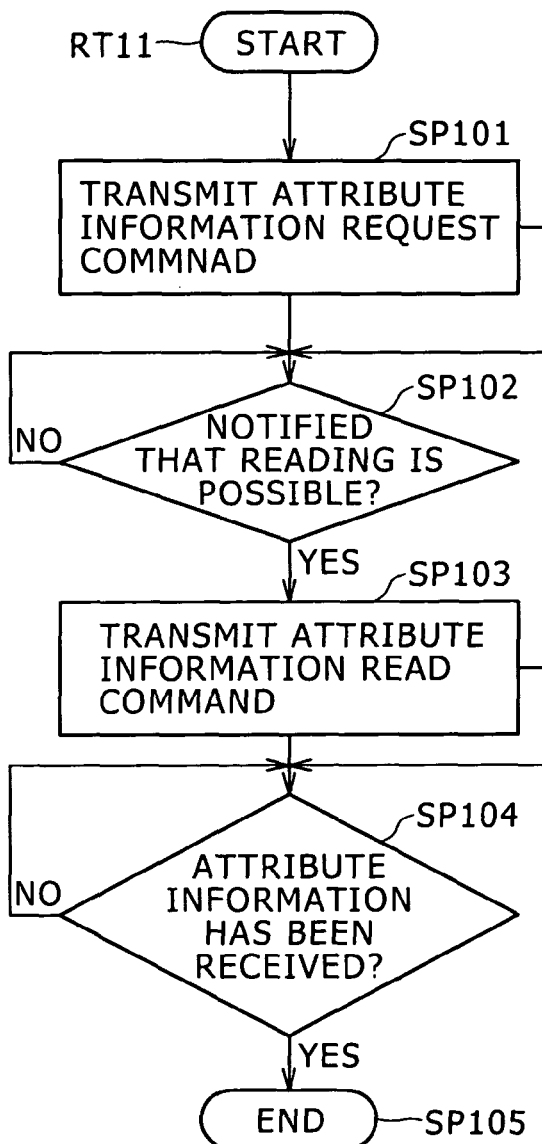
FIG. 6 is a flowchart illustrating an attribute information acquisition process.
Figure 6B:
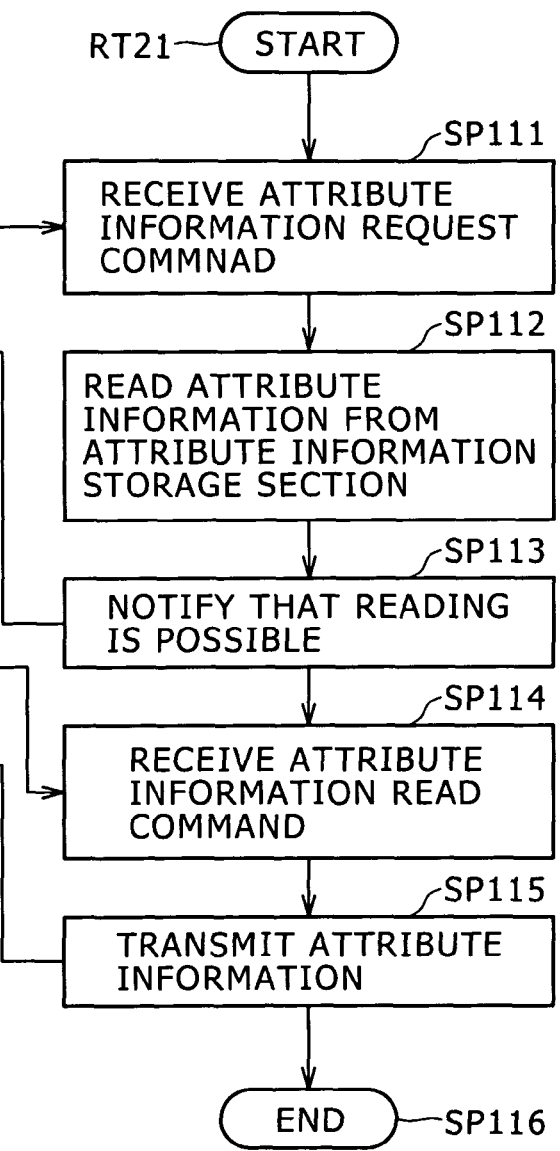

After starting the routine RT1 on the electronic apparatus 2 side in such a situation, the CPU 5 of the electronic apparatus 2 proceeds to step SP1 and performs an attribute information acquisition process in cooperation with the card type semiconductor storage device 3. At this point, the CPU 5 of the electronic apparatus 2 starts a routine RT11 on the electronic apparatus 2 side of the attribute information acquisition process as illustrated in FIG. 6. After starting the routine RT11, the CPU 5 proceeds to step SP101 and transmits an "attribute information request command" to the card type semiconductor storage device 3 via the host interface 11. Then, the CPU 5 proceeds to step SP102. At this point, the control circuit 25, which has started a routine RT21 on the card type semiconductor storage device 3 side of the attribute information acquisition process, allows reception of the attribute information request command transmitted from the electronic apparatus 2 via the external connection terminals T6 to T8, for example, and allows it to be transferred to and written on the register 23 via the external interface circuit 22 at step SP111. Then, at step SP112, the control circuit 25 reads the attribute information 35 from the attribute information storage section 31 in response to the attribute information request command written on the register 23, and transfers the attribute information 35 to the data buffer circuit 26 and brings it into a state capable of being read by the electronic apparatus 2. Then, the control circuit 25 proceeds to step SP113. At step SP113, the control circuit 25 notifies the electronic apparatus 2 that the attribute information 35 has become readable, and then proceeds to step SP114.

At this point, at step SP102, the CPU 5 is waiting to receive, from the card type semiconductor storage device 3, notification that reading of the attribute information 35 has become possible. If the CPU 5 is notified that the reading of the attribute information 35 has become possible, the CPU 5 proceeds to step SP103. At step SP103, the CPU 5 transmits an "attribute information read command" to the card type semiconductor storage device 3 via the host interface 11, and then proceeds to step SP104. At this point, at step SP114, the control circuit 25 allows reception of the attribute information read command transmitted from the electronic apparatus 2 via the external connection terminals T6 to T8, for example, and allows it to be transferred to and written on the register 23 via the external interface circuit 22. Then, at step SP115, in response to the attribute information read command written on the register 23, the control circuit 25 transmits the attribute information 35 within the data buffer circuit 26 to the electronic apparatus 2 via the external interface circuit 22 and the external connection terminals T6 to T8, for example. Thereafter, the control circuit 25 proceeds to step SP116 and finishes the routine RT21 on the card type semiconductor storage device 3 side of the attribute information acquisition process.

At this point, at step SP104, the CPU 5 is waiting to receive the attribute information 35 to be transmitted from the card type semiconductor storage device 3 and, if it receives the attribute information 35, stores the attribute information 35 temporarily in the RAM 8, for example. Then, the CPU 5 proceeds to step SP105. As a result, the CPU 5 finishes the routine RT11 on the electronic apparatus 2 side, thereby exiting from the attribute information acquisition process, and proceeds to step SP2 of the routine RT1 on the electronic apparatus 2 side of the mode setting process illustrated in FIG. 5.

At step SP2, based on the attribute information 35 acquired from the card type semiconductor storage device 3 and the apparatus abilities, the CPU 5 selects, from the plurality of communication modes indicated by the communication mode information 33 within the attribute information 35 and the plurality of operation modes indicated by the operation mode information 34 within the attribute information 35, an arbitrary combination of a communication mode and an operation mode in which to cause the card type semiconductor storage device 3 to operate. Then, the CPU 5 proceeds to step SP3. At step SP3, the CPU 5 determines whether the initial communication mode, which is at the time selected as the initial setting in the card type semiconductor storage device 3, is to be changed. If the determination at step SP3 is affirmative, this means that the electronic apparatus 2 has a relatively high communication ability and is capable of communicating with the card type semiconductor storage device 3 in a different communication mode from the initial communication mode (i.e., a different communication mode from the initial communication mode has been selected at step SP2). Therefore, if the determination at step SP3 is affirmative, the CPU 5 proceeds to step SP4 and performs a communication mode setting process in cooperation with the card type semiconductor storage device 3.

At this point, the CPU 5 of the electronic apparatus 2 starts a routine RT12 on the electronic apparatus 2 side of the communication mode setting process as illustrated in FIG. 7. After starting the routine RT12, the CPU 5 proceeds to step SP401 and transmits communication mode setting information indicating the selected communication mode to the card type semiconductor storage device 3 via the host interface 11. Then, the CPU 5 proceeds to step SP402. At step SP402, the CPU 5 transmits a communication mode setting command for directing the card type semiconductor storage device 3 to set the communication mode to the card type semiconductor storage device 3 via the host interface 11. Then, the CPU 5 proceeds to step SP403. Meanwhile, the control circuit 25, which has started a routine RT22 on the card type semiconductor storage device 3 side of the communication mode setting process, allows reception of the communication mode setting information transmitted from the electronic apparatus 2 via the external connection terminals T6 to T8, for example, and allows it to be transferred to and written on the register 23 via the external interface circuit 22 at step SP411. Thereafter, at step SP412, the control circuit 25 allows reception of the communication mode setting command transmitted from the electronic apparatus 2 via the external connection terminals T6 to T8, for example, and allows it to be transferred to and written on the register 23 via the external interface circuit 22. Then, at step SP413, in accordance with the communication mode setting command written on the register 23, the control circuit 25 makes a setting so as to perform data communication in the communication mode indicated by the communication mode setting information written on the register 23.

Then, at step SP414, the control circuit 25 notifies the electronic apparatus 2 that the setting of the communication mode has been completed. Then, the control circuit 25 proceeds to step SP415 and finishes the routine RT22 on the card type semiconductor storage device 3 side of the communication mode setting process. Meanwhile, at step SP403, the CPU 5 is waiting to receive, from the card type semiconductor storage device 3, a notification that the setting of the communication mode has been completed and, if it is notified that the setting of the communication mode has been completed, proceeds to step SP404. As a result, the CPU 5 finishes the routine RT12 on the electronic apparatus 2 side and exits from the communication mode setting process, and proceeds to step SP5 of the routine RT1 on the electronic apparatus 2 side of the mode setting process illustrated in FIG. 5.

At step SP5, the CPU 5 determines whether the initial operation mode, which is at the time selected as the initial setting in the card type semiconductor storage device 3, is to be changed. If the determination at step SP5 is affirmative, this means that the electronic apparatus 2 has a relatively high operating current supplying ability and is capable of causing the card type semiconductor storage device 3 to operate in a different operation mode from the initial operation mode (i.e., a different operation mode from the initial operation mode has been selected at step SP2). Therefore, if the determination at step SP5 is affirmative, the CPU 5 proceeds to step SP6 and performs an operation mode setting process in cooperation with the card type semiconductor storage device 3.

Figure 8A:
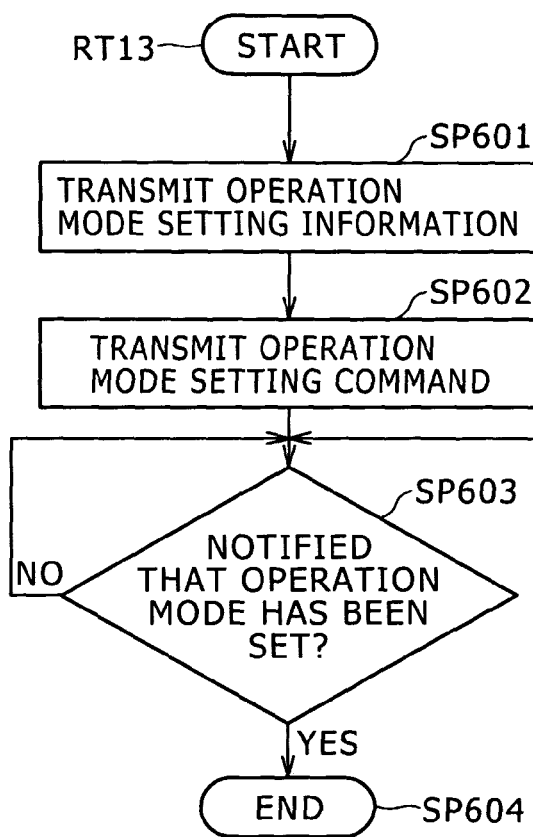
FIG. 8 is a flowchart illustrating an operation mode setting process.
Figure 8B:
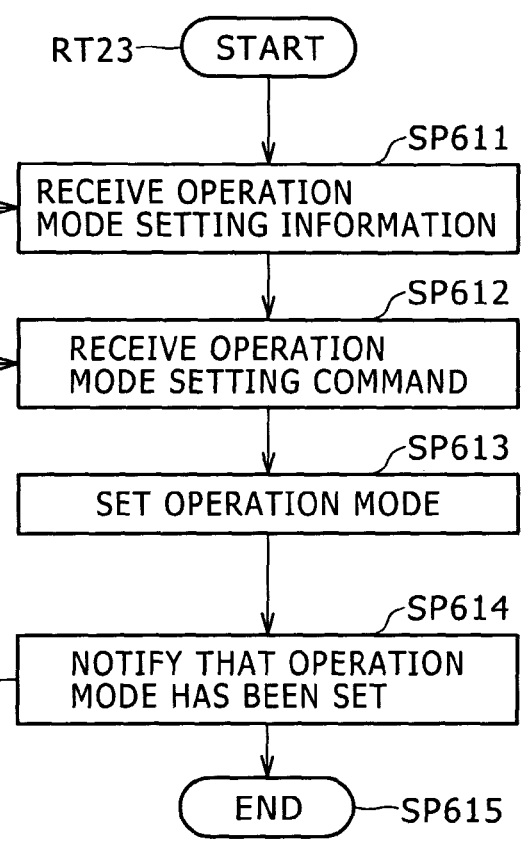

At this point, the CPU 5 of the electronic apparatus 2 starts a routine RT13 on the electronic apparatus 2 side of the operation mode setting process as illustrated in FIG. 8. After starting the routine RT13, the CPU 5 proceeds to step SP601 and transmits operation mode setting information indicating the selected operation mode to the card type semiconductor storage device 3 via the host interface 11. Then, the CPU 5 proceeds to step SP602. At step SP602, the CPU 5 transmits an operation mode setting command for directing the card type semiconductor storage device 3 to set the operation mode to the card type semiconductor storage device 3 via the host interface 11. Then, the CPU 5 proceeds to step SP603. Meanwhile, the control circuit 25, which has started a routine RT23 on the card type semiconductor storage device 3 side of the operation mode setting process, allows reception of the operation mode setting information transmitted from the electronic apparatus 2 via the external connection terminals T6 to T8, for example, and allows it to be transferred to and written on the register 23 via the external interface circuit 22 at step SP611. Thereafter, at step SP612, the control circuit 25 allows reception of the operation mode setting command transmitted from the electronic apparatus 2 via the external connection terminals T6 to T8, for example, and allows it to be transferred to and written on the register 23 via the external interface circuit 22. Then, at step SP613, in accordance with the operation mode setting command written on the register 23, the control circuit 25 makes a setting so as to perform data communication in the operation mode indicated by the operation mode setting information written on the register 23.

Then, at step SP614, the control circuit 25 notifies the electronic apparatus 2 that the setting of the operation mode has been completed. Then, the control circuit 25 proceeds to step SP615. As a result, the control circuit 25 finishes the routine RT23 on the card type semiconductor storage device 3 side of the operation mode setting process, and proceeds to step SP7 of the routine RT2 on the card type semiconductor storage device 3 side of the mode setting process illustrated in FIG. 5, thereby finishing the routine RT2 as well. Meanwhile, at step SP603, the CPU 5 is waiting to receive, from the card type semiconductor storage device 3, a notification that the setting of the operation mode has been completed and, if it is notified that the setting of the operation mode has been completed, proceeds to step SP604. As a result, the CPU 5 finishes the routine RT13 on the electronic apparatus 2 side, thereby exiting from the operation mode setting process, and proceeds to step SP8 of the routine RT1 on the electronic apparatus 2 side of the mode setting process illustrated in FIG. 5, thereby finishing the routine RT1 as well. In the above-described procedure, the CPU 5 of the electronic apparatus 2 sets the data processing environment for the card type semiconductor storage device 3 in cooperation with the control circuit 25 of the card type semiconductor storage device 3.

Note that if the determination at the above-described step SP3 is negative, this means that the electronic apparatus 2 originally has a low communication ability or the current processing load on the electronic apparatus 2 is relatively large, and that therefore the data communication with the card type semiconductor storage device 3 is to be performed in the initial communication mode (i.e., the initial communication mode has been selected at step SP2). Therefore, if the determination at the above-described step SP3 is negative, the CPU 5 proceeds to step SP5. Also note that if the determination at the above-described step SP5 is negative, this means that the electronic apparatus 2 originally has a low operating current supplying ability or the current processing load on the electronic apparatus 2 is relatively large, for example, and that therefore the card type semiconductor storage device 3 is to be caused to operate in the initial operation mode (i.e., the initial operation mode has been selected at step SP2). Therefore, if the determination at the above-described step SP5 is negative, the CPU 5 proceeds to step SP8.

After the card type semiconductor storage device 3 is attached to the electronic apparatus 2 and the data processing environment for the card type semiconductor storage device 3 is established, the CPU 5 of the electronic apparatus 2 starts a routine RT3 on the electronic apparatus 2 side of a mode setting change process as illustrated in FIG. 9 in accordance with the mode setting program. After starting the routine RT3 on the electronic apparatus 2 side, the CPU 5 proceeds to step SP11 and determines whether at least one of the communication mode and the operation mode which have been set for the card type semiconductor storage device 3 is to be changed.

Specifically, while the card type semiconductor storage device 3 is attached to the electronic apparatus 2, the CPU 5 may be performing a process specific to the electronic apparatus 2 (hereinafter referred to as a "apparatus-specific process") other than a process performed in conjunction with the card type semiconductor storage device 3 (hereinafter referred to as a "semiconductor storage device using process"), such as data communication, writing and reading of data, or the like. Therefore, while the card type semiconductor storage device 3 is attached to the electronic apparatus 2, the CPU 5 monitors a processing load of the apparatus-specific process as well as a processing load of the semiconductor storage device using process. If the processing load of the apparatus-specific process increases considerably, making it difficult to maintain the semiconductor storage device using process, the CPU 5 determines to change at least one of the communication mode and the operation mode which are currently adopted in the card type semiconductor storage device 3 to another communication mode or operation mode with a lower communication ability or operation ability. Also, if, in a situation where a communication mode or an operation mode with a low communication ability or operation ability had been selected and is currently adopted in the card type semiconductor storage device 3 because of a considerably large processing load of the apparatus-specific process, the processing load of the apparatus-specific process decreases, the CPU 5 determines to change at least one of the communication mode and the operation mode which are currently adopted in the card type semiconductor storage device 3 to another communication mode or operation mode with a high communication ability or operation ability.

In addition, in the case where the electronic apparatus 2 is being powered by a battery, for example, the CPU 5 monitors the remaining amount of charge in the battery. If the remaining amount of charge in the battery decreases so much that it becomes difficult to maintain the currently-supplied level of the operating current (i.e., to supply an operating current substantially equal to the operating current that has been supplied up to the moment) to the card type semiconductor storage device 3, the CPU 5 determines to change at least one of the communication mode and the operation mode which are currently adopted in the card type semiconductor storage device 3 to another communication mode or operation mode with a low communication ability or operation ability. Conversely, if, in a situation where a communication mode or operation mode with a low communication ability or operation ability had been selected and is currently adopted in the card type semiconductor storage device 3 because of a small remaining amount of charge in the battery, the battery is charged to increase the remaining amount of charge in the battery, for example, the CPU 5 determines to change at least one of the communication mode and the operation mode which are currently adopted in the card type semiconductor storage device 3 to another communication mode or operation mode with a high communication ability or operation ability.

If the CPU 5 determines to change at least one of the communication mode and the operation mode as described above at step SP11, the CPU 5 proceeds to step SP12. At step SP12, the CPU 5 reads the attribute information 35 from the RAM 8 already stored therein and then, referring as appropriate to the read attribute information 35 and the apparatus abilities and, besides, the current processing load of the semiconductor storage device using process, the current processing load of the apparatus-specific process, the current remaining amount of charge in the battery, and the like, the CPU 5 reselects at least one of the communication mode and the operation mode by arbitrarily selecting newly, from among the plurality of communication modes indicated by the communication mode information 33 within the attribute information 35 and the plurality of operation modes indicated by the operation mode information 34 within the attribute information 35, at least one of the communication modes and the operation modes in which to cause the card type semiconductor storage device 3 to operate. Then, the CPU 5 proceeds to step SP13.

At step SP13, the CPU 5 determines whether the communication mode which is currently adopted in the card type semiconductor storage device 3 is to be changed. If the determination at step SP13 is affirmative, this means that the electronic apparatus 2 has selected a new communication mode. Therefore, if the determination at step SP13 is affirmative, the CPU 5 proceeds to step SP4 and performs the communication mode setting process in cooperation with the card type semiconductor storage device 3 in the above-described manner. Note that, however, at step SP402 of the communication mode setting process, the CPU 5 transmits, to the card type semiconductor storage device 3, a "communication mode setting change command" to give an instruction to change the setting of the communication mode. Then, after exiting from the communication mode setting process, the CPU 5 proceeds to step SP14.

At step SP14, the CPU 5 determines whether the operation mode which is currently adopted in the card type semiconductor storage device 3 is to be changed. If the determination at step SP14 is affirmative, this means that the electronic apparatus 2 has selected a new operation mode. Therefore, if the determination at step SP14 is affirmative, the CPU 5 proceeds to step SP6 and performs the operation mode setting process in cooperation with the card type semiconductor storage device 3 in the above-described manner. Note that, however, at step SP602 of the operation mode setting process, the CPU 5 transmits, to the card type semiconductor storage device 3, an "operation mode setting change command" to give an instruction to change the setting of the operation mode. Then, after exiting from the operation mode setting process, the CPU 5 proceeds to step SP15. At this point, the control circuit 25 of the card type semiconductor storage device 3 also exits from the operation mode setting process and proceeds to step SP21. Thus, the CPU 5, together with the control circuit 25, finishes the mode setting change process.

Note that if the determination at the above-described step SP13 is negative, this means that the electronic apparatus 2 has not selected a new communication mode. Therefore, if the determination at the above-described step SP13 is negative, the CPU 5 proceeds to step SP14. Also, if the determination at the above-described step SP14 is negative, this means that the electronic apparatus 2 has not selected a new operation mode. Therefore, if the determination at the above-described step SP14 is negative, the CPU 5 proceeds to step SP15.

Figure 10:
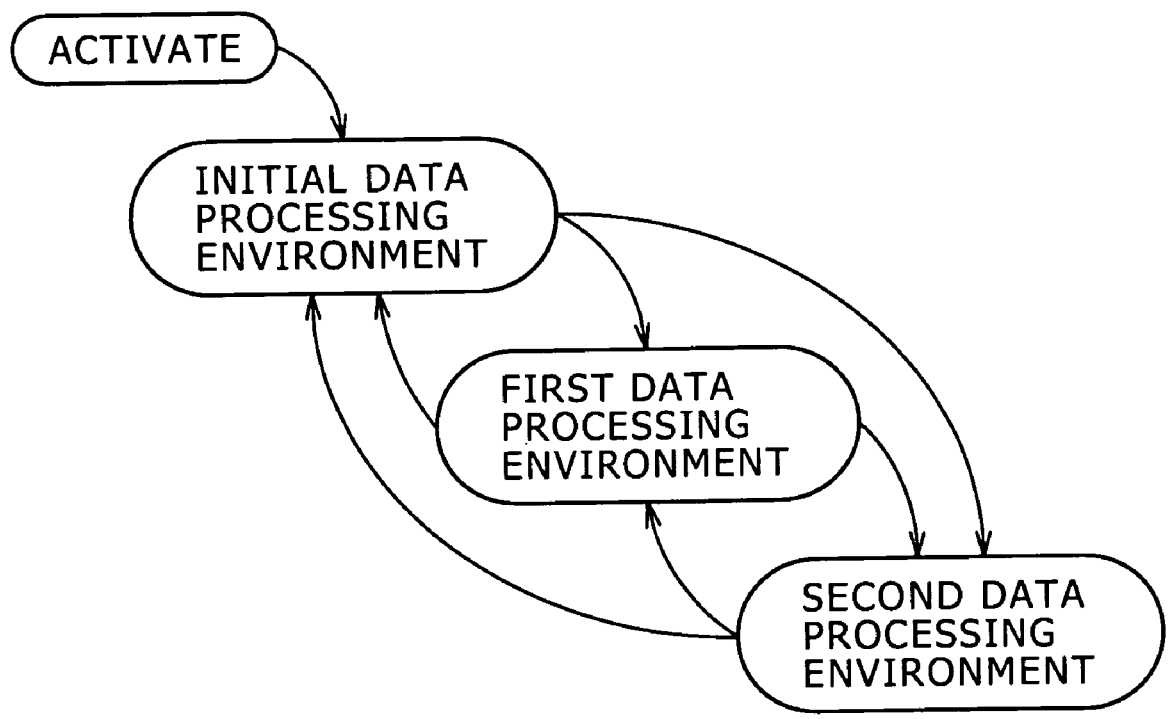
FIG. 10 is a diagram for explaining the transition of a data processing environment in the card type semiconductor storage device.

As described above, after setting the communication mode and the operation mode for the card type semiconductor storage device 3, the CPU 5 is able to change and reconfigure those settings as necessary. That is, as illustrated in FIG. 10, when the card type semiconductor storage device 3 is attached to the electronic apparatus 2 and activated, the control circuit 25 of the card type semiconductor storage device 3 sets the communication mode and the operation mode to the initial communication mode and the initial operation mode, respectively, and initializes the data processing environment so as to perform data processing in accordance therewith. However, in accordance with the apparatus abilities, the processing loads of the semiconductor storage device using process and the apparatus-specific process, the remaining amount of charge in the battery, and the like, the CPU 5 is able to reconfigure the communication mode and/or the operation mode of the card type semiconductor storage device 3. It is thus possible to transition the data processing environment from the initial configuration (hereinafter referred to as an "initial data processing environment") to a first data processing environment with a higher data throughput than the initial data processing environment or to a second data processing environment with a higher data throughput than the first data processing environment in a stepwise manner or directly. In addition, after once setting the data processing environment of the card type semiconductor storage device 3 to the first or second data processing environment with a high data throughput, the CPU 5 is able to transition the data processing environment from the first or second data processing environment to the initial data processing environment or the first data processing environment with a lower data throughput in a stepwise manner or directly.

As described above, the card type semiconductor storage device 3 is configured to be capable of performing data communication in a plurality of communication modes as well as operating in a plurality of operation modes each with a separate maximum current consumption, and has the attribute information 35 indicating the plurality of communication modes and the plurality of operation modes previously stored in the attribute information storage section 31. When the card type semiconductor storage device 3 is attached to the electronic apparatus 2 and communication therebetween is established, the electronic apparatus 2 reads the attribute information 35 from the attribute information storage section 31 of the card type semiconductor storage device 3 and selects, from the plurality of communication modes and the plurality of operation modes indicated by the read attribute information 35, an arbitrary combination of a communication mode and an operation mode in accordance with the apparatus abilities of the electronic apparatus 2. Then, the electronic apparatus 2 transmits, to the card type semiconductor storage device 3, the communication mode setting command and the operation mode setting command (hereinafter referred to collectively as "mode setting commands") for setting the communication mode and the operation mode of the card type semiconductor storage device 3 to the selected communication mode and the selected operation mode, respectively.

As a result, the card type semiconductor storage device 3 configures itself to operate in the combination of the communication mode and the operation mode selected arbitrarily by the electronic apparatus 2. Therefore, instead of being operable in combinations of each one of the plurality of communication modes and a particular one of the plurality of operation modes that is uniquely associated with the communication mode, the card type semiconductor storage device 3 is capable of operating in an arbitrary combination of an operation mode and a communication mode arbitrarily selected from among the plurality of communication modes and the plurality of operation modes.

Therefore, the card type semiconductor storage device 3 is not only capable of operating when attached to an electronic apparatus that shares a common communication mode with the card type semiconductor storage device 3 and that has a capability to supply the only operating current that matches the shared communication mode, but also capable of operating without any problem when attached to any electronic apparatus that shares at least one of the plurality of communication modes and at least one of the plurality of operation modes with the semiconductor storage device 3. Therefore, the number of electronic apparatuses that are capable of having the card type semiconductor storage device 3 attached thereto but not capable of causing the card type semiconductor storage device 3 to operate is greatly reduced.

As described above, in the electronic apparatus 2 to which is attached the card type semiconductor storage device 3, which is capable of operating in the plurality of operation modes each with a separate maximum current consumption and also capable of performing data communication in the plurality of communication modes, the attribute information 35 indicating the plurality of operation modes and the plurality of communication modes is received from the card type semiconductor storage device 3; an arbitrary combination of an operation mode and a communication mode is selected from among the plurality of operation modes and the plurality of communication modes indicated by the received attribute information 35; and the mode setting commands for setting the card type semiconductor storage device 3 to the selected combination of the operation mode and the communication mode is transmitted to the card type semiconductor storage device 3. Thus, the electronic apparatus 2 is able to cause the card type semiconductor storage device 3 to operate in the combination of the operation mode and the communication mode arbitrarily selected from among the plurality of communication modes and the plurality of operation modes. As a result, the card type semiconductor storage device 3 can greatly reduce the number of electronic apparatuses that are capable of having the card type semiconductor storage device 3 attached thereto but not capable of causing it to operate. Thus, the card type semiconductor storage device 3 achieves significantly improved compatibility with electronic apparatuses.

In addition, the card type semiconductor storage device 3 is so configured that the number of operating semiconductor memories SM1 to SMn is changeable in accordance with the communication mode selected, while the electronic apparatus 2 is capable of setting the card type semiconductor storage device 3 to an operation mode selected by the electronic apparatus 2. Therefore, the electronic apparatus 2 is able to select an optimum operation mode and set the card type semiconductor storage device 3 to the optimum operation mode in accordance with the communication mode arbitrarily selected so as to increase the operation ability of the card type semiconductor storage device 3 to the utmost, whereby the card type semiconductor storage device 3 is able to operate so as to exhibit its maximum data throughput.

Further, when the processing load of the apparatus-specific process has been considerably increased or the remaining amount of charge in the battery has been reduced, the electronic apparatus 2 is capable of reselecting the communication mode and/or the operation mode of the card type semiconductor storage device 3 and changing the communication mode and/or the operation mode thereof to a newly-selected communication mode and/or operation mode. Further, in the case where the processing load of the apparatus-specific process is reduced or the battery is charged to increase the remaining amount of charge therein after the setting of the communication mode and/or the operation mode of the card type semiconductor storage device 3 is changed, the electronic apparatus 2 is capable of reselecting the communication mode and/or the operation mode of the card type semiconductor storage device 3 and changes the setting of the communication mode and/or the operation mode thereof to a newly-selected communication mode or operation mode. In other words, the electronic apparatus 2 is capable of changing the data processing environment of the card type semiconductor storage device 3 as necessary in accordance with its own status. Therefore, the electronic apparatus 2 is capable of preventing discontinuance of data processing involving the use of the card type semiconductor storage device 3 because of inability to control the card type semiconductor storage device 3. In addition, the electronic apparatus 2 is capable of preventing a situation in which despite an ability to cause the card type semiconductor storage device 3 to perform data processing with a relatively high data throughput, the electronic apparatus 2 causes the card type semiconductor storage device 3 to perform data processing with a relatively low data throughput, failing to make efficient use of the card type semiconductor storage device 3.

In specifications of card type semiconductor storage devices in related art, one communication mode is associated with one operation mode so that one maximum current consumption is uniquely determined for the communication mode. Therefore, in the specifications of the card type semiconductor storage devices in related art, the same communication mode associated with different operation modes leads to different specifications. In contrast, in the card type semiconductor storage device 3 according to the present embodiment, it is possible to select an arbitrary combination of a communication mode and an operation mode from among the plurality of communication modes and the plurality of operation modes. Therefore, even when a new operation mode is additionally prepared that can be selected in combination with a communication mode, for example, there is no need to create an utterly new specification in which the new operation mode is associated with the communication mode. By simply adding the new operation mode to an existing specification and updating the specification, it becomes possible to easily realize a setting of a combination of the new operation mode and the communication mode. Thus, in the case of specifications of the card type semiconductor storage device 3 according to the present embodiment, as opposed to the specifications of the card type semiconductor storage devices in related art, old and new specifications may have compatibility therebetween, which gives extensibility to the life span of the specifications (i.e., allows the specifications to survive longer).

Note that, in the above-described embodiment, the card type semiconductor storage device 3 provides the attribute information 35 to the electronic apparatus 2 in response to the request from the electronic apparatus 2. However, the present invention is not limited to this. The card type semiconductor storage device 3 may automatically provide the attribute information 35 to the electronic apparatus 2 when the card type semiconductor storage device 3 has been activated and communication with the electronic apparatus 2 has been established.

Also note that, in the above-described embodiment, after the electronic apparatus 2 sets the communication mode for the card type semiconductor storage device 3, the electronic apparatus 2 sets the operation mode therefore. However, the present invention is not limited to this. The communication mode may be set after the operation mode.

Also note that the above-described embodiment refers to an exemplary case where a semiconductor storage device according to the present invention is embodied by the card type semiconductor storage device 3 as described above with reference to FIGS. 1 to 10. However, the present invention is not limited to this example. The present invention is widely applicable to various other types of semiconductor storage devices which are attachable to an electronic apparatus, such as a stick type semiconductor storage device and the like.

Also note that the above-described embodiment refers to an exemplary case where an electronic apparatus according to the present invention is embodied by the electronic apparatus 2, such as a personal computer, as described above with reference to FIGS. 1 to 10. However, the present invention is not limited to this example. The present invention is widely applicable to various other types of electronic apparatuses to which a semiconductor storage device is attachable, such as a digital still camera, a portable audio player, an electronic dictionary, and the like.

Also note that the above-described embodiment refers to an exemplary case where a data communication section capable of performing data communication with an outside in a plurality of communication modes is embodied by the external interface circuit 22, the register 23, the data buffer circuit 26, and the control circuit 25 of the card type semiconductor storage device 3 as described above with reference to FIGS. 1 to 10. However, the present invention is not limited to this example. Various other types of data communication sections are widely applicable to the present invention.

Also note that the above-described embodiment refers to an exemplary case where a mode setting section configured to set the semiconductor storage device to one of the plurality of operation modes and one of the plurality of communication modes indicated by attribute information stored in an attribute information storage section is embodied by the control circuit 25, such as a sequencer, of the card type semiconductor storage device 3 as described above with reference to FIGS. 1 to 10. However, the present invention is not limited to this example. Various other types of mode setting sections, such as a CPU, a microprocessor, and the like, are widely applicable to the present invention.

Also note that the above-described embodiment refers to an exemplary case where a reception section configured to receive attribute information indicating the plurality of operation modes and the plurality of communication modes transmitted from the semiconductor storage device is embodied by the host interface 11 of the electronic apparatus 2 as described above with reference to FIGS. 1 to 10. However, the present invention is not limited to this example. Various other types of reception sections are widely applicable to the present invention.

Also note that the above-described embodiment refers to an exemplary case where a mode selection section configured to select an arbitrary combination of an operation mode and a communication mode from among the plurality of operation modes and the plurality of communication modes indicated by the attribute information received by the reception section is embodied by the CPU 5 of the electronic apparatus 2 as described above with reference to FIGS. 1 to 10. However, the present invention is not limited to this example. Various other types of mode setting sections, such as a mode setting circuit formed by hardware circuitry or the like, are widely applicable to the present invention.

Also note that the above-described embodiment refers to an exemplary case where a transmission section configured to transmit to the semiconductor storage device a mode setting command for directing that the semiconductor storage device be set to the combination of the operation mode and the communication mode selected by the mode selection section is embodied by the host interface 11 of the electronic apparatus 2 as described above with reference to FIGS. 1 to 10. However, the present invention is not limited to this example. Various other types of transmission sections are widely applicable to the present invention.

The present invention is applicable to semiconductor storage devices, such as a card type semiconductor storage device and the like, and electronic apparatuses to which such a semiconductor storage device is attachable, such as a personal computer, a digital still camera, and the like.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor storage device capable of operating in a plurality of operation modes including different maximum current consumptions and a plurality of communication modes including at least two different data-width paths selected from the group consisting of serial and n-bit parallel modes (where n>=2), the device comprising:
    a data communication section configured to be capable of performing data communication with an external electronic device in a plurality of communication modes and in a plurality of operation modes;
    an attribute information storage section configured to store attribute information that indicates the plurality of operation modes and the plurality of communication modes supported by the semiconductor storage device; and
    a mode setting section configured to set the semiconductor storage device to one of the plurality of operation modes and one of the plurality of communication modes,
        circuitry for setting an initial operation mode and communication mode;
    wherein said data communication section transmits, to the external electronic device to which the semiconductor storage device is attached, attribute information read from said attribute information storage section while operating in the initial operation mode and communication mode, and receives from the external electronic device a mode setting command for directing that the semiconductor storage device operate in a selected operation mode and communication mode selected from among the plurality of operation modes and the plurality of communication modes indicated as supported by the attribute information, and
    wherein, in accordance with the mode setting command received by said data communication section, said mode setting section sets the semiconductor storage device to the respective operation mode and the communication mode selected by the external electronic device; and wherein a number of active memory portions is chanced depending upon the operation mode to which the semiconductor storage device is set and the semiconductor storage device is capable of operating in an arbitrary combination of an operating mode and communication mode.

2. The semiconductor storage device according to claim 1, wherein the combination of the operation mode and the communication mode is selected by the external electronic device from among the plurality of operation modes and the plurality of communication modes indicated by the attribute information in accordance with apparatus abilities of the external electronic device.

3. The semiconductor storage device according to claim 2, wherein, after said mode setting section sets the semiconductor storage device to the operation mode and the communication mode selected by the external electronic device, said data communication section receives from the external electronic device a mode setting change command for directing that at least one of the operation mode and the communication mode currently adopted in the semiconductor storage device be replaced by an operation mode or a communication mode newly selected by the external electronic device from among the plurality of operation modes and the plurality of communication modes indicated by the attribute information in accordance with a processing load of the external electronic device, and
    wherein, in accordance with the mode setting change command received by said data communication section, said mode setting section reconfigures the semiconductor storage device so that the at least one of the operation mode and the communication mode currently adopted in the semiconductor storage device is replaced by the operation mode or the communication mode newly selected by the external electronic device.

4. An electronic apparatus capable of having attached thereto a semiconductor storage device capable of operating in a plurality of operation modes each having a different maximum current consumption and also capable of performing data communication in a plurality of communication modes including at least two different data-width paths selected from the group consisting of serial and n-bit parallel modes (where n>=2), the apparatus comprising:
    circuitry for setting an initial operation mode and communication mode;
    a reception section configured to receive attribute information indicating the plurality of operation modes and the plurality of communication modes supported by the semiconductor storage device while operating in the initial operation mode and communication mode, the attribute information being transmitted from the semiconductor storage device;
    a mode selection section configured to select a combination of an operation mode and a communication mode; and
    a transmission section configured to transmit to the semiconductor storage device a mode setting command for directing that the semiconductor storage device be set to the operation mode and the communication mode selected by said mode selection section; and wherein a number of active memory portions is changed depending upon the operation mode to which the semiconductor storage device is set and the semiconductor storage device is capable of operating in an arbitrary combination of an operating mode and communication mode.

5. The electronic apparatus according to claim 4, wherein said mode selection section selects the operation mode and the communication mode from among the plurality of operation modes and the plurality of communication modes indicated by the attribute information in accordance with apparatus abilities of the electronic apparatus.

6. The electronic apparatus according to claim 5, wherein, after said transmission section transmits the mode setting command to the semiconductor storage device, said mode selection section newly selects at least one of an operation mode and a communication mode from among the plurality of operation modes and the plurality of communication modes indicated by the attribute information in accordance with a processing load of the electronic apparatus, and wherein said transmission section transmits to the semiconductor storage device a mode setting change command for directing that the semiconductor storage device be reconfigured to adopt the at least one of the operation mode and the communication mode newly selected by said mode selection section.

7. A mode setting method for an electronic apparatus to set a semiconductor storage device capable of operating in a plurality of operation modes each having a different maximum current consumption and also capable of performing data communication in a plurality of communication modes including at least two different data-width paths selected from the group consisting of serial and n-bit parallel modes (where n>=2), the electronic apparatus being attached to the semiconductor storage device, the method comprising:

setting an initial operation mode and communication mode for communication between the electronic apparatus and the semiconductor storage device;

receiving attribute information indicating the plurality of operation modes and the plurality of communication modes supported by the semiconductor storage device, the attribute information being transmitted from the semiconductor storage device while operating in the initial operation mode and communication mode;

selecting a combination of an operation mode and a communication mode from among the plurality of operation modes and the plurality of communication modes; and transmitting to the semiconductor storage device a mode setting command for directing that the semiconductor storage device be set to the operation mode and the communication mode selected in said selecting step; and wherein a number of active memory portions is changed depending upon the operation mode to which the semiconductor storage device is set and the semiconductor storage device is capable of operating in an arbitrary combination of an operating mode and communication mode.

8. The semiconductor storage device according to claim 1, wherein said device defaults to a lowest maximum current consumption operation mode and a serial communication mode upon interface with the external electronic device, and only upon subsequent exchange of attribute information, is the semiconductor storage device placed into a higher maximum current consumption operation mode and/or an n-bit parallel communication mode.

9. The semiconductor storage device according to claim 2, wherein said apparatus abilities include at least a remaining charge of a battery powering said external electronic device, wherein a lower performing communication and/or operation mode when the battery charge level is low compared to when the battery charge level is high.

10. The electronic apparatus according to claim 5, wherein said apparatus abilities include at least a remaining charge of a battery powering said external electronic device, wherein a lower performing communication and/or operation mode when the battery charge level is low compared to when the battery charge level is high.

11. The electronic apparatus according to claim 10, wherein said electronic apparatus continuously monitors the battery charge level, and automatically selects a lower performing communication and/or operation mode when the battery charge level is low by transmitting a new mode setting command to the semiconductor storage device.

12. The mode setting method according to claim 7, wherein, in said selecting step, said electronic apparatus selects the operation mode and the communication mode from among the plurality of operation modes and the plurality of communication modes indicated by the attribute information in accordance with apparatus abilities of the electronic apparatus.

13. The mode setting method according to claim 12, further comprising the step of, after said transmitting step for transmitting the mode setting command to the semiconductor storage device, a second step of newly selecting at least one of an operation mode and a communication mode from among the plurality of operation modes and the plurality of communication modes indicated by the attribute information in accordance with a processing load of the electronic apparatus, and transmitting the new mode setting change command for directing that the semiconductor storage device be reconfigured to adopt the at least one of the operation mode and the communication mode newly selected by said mode selection section.

14. The mode setting method according to claim 12, wherein said apparatus abilities include at least a remaining charge of a battery powering said external electronic device, wherein a lower performing communication and/or operation mode when the battery charge level is low compared to when the battery charge level is high.

15. The mode setting method according to claim 14, wherein said electronic apparatus continuously monitors the battery charge level, and automatically selects a lower performing communication and/or operation mode when the battery charge level is low by transmitting a new mode setting command to the semiconductor storage device.

* * * * *